United States Patent
Johnson

(10) Patent No.: US 6,949,956 B2
(45) Date of Patent: Sep. 27, 2005

(54) GENERAL PURPOSE DELAY LOGIC

(75) Inventor: Tyler James Johnson, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 133 days.

(21) Appl. No.: 10/453,129

(22) Filed: Jun. 3, 2003

(65) Prior Publication Data

US 2004/0222819 A1 Nov. 11, 2004

Related U.S. Application Data

(60) Provisional application No. 60/469,168, filed on May 9, 2003, provisional application No. 60/469,350, filed on May 9, 2003, and provisional application No. 60/469,575, filed on May 10, 2003.

(51) Int. Cl.$^7$ .............................................. H03K 19/00
(52) U.S. Cl. ......................... 326/99; 327/276; 327/277; 327/284
(58) Field of Search ..................... 326/93, 99; 327/276, 327/277, 284

(56) References Cited

U.S. PATENT DOCUMENTS 6,281,728 B1 * 8/2001 Sung ......................... 327/158

OTHER PUBLICATIONS

Bart Vermeulen and Sandeep Kumar Goel, "Design for Debug: Catching Design Errors in Digital Chips", IEEE Design & Test of Computers; May–Jun. 2002; pp. 37–45.
Affidavit of Richard W. Adkisson, Feb. 17, 2005, 4 pages.

* cited by examiner

Primary Examiner—Anh Q. Tran

(57) ABSTRACT

A logic circuit for delaying a signal input thereto a specified number of clock cycles X, wherein X is between 1 and $2^N$ is described. In one embodiment, the logic circuit comprises a demultiplexer ("DEMUX") comprising an input for receiving the signal and N outputs; a register array comprising $2^N$ clocked registers, wherein each of a first N of the clocked registers is connected to one of the N outputs of the DEMUX and wherein data is shifted out of one clocked register to a next clocked register on each clock cycle; and a multiplexer ("MUX") comprising M inputs, wherein each of the M inputs is connected to one of the clocked registers.

29 Claims, 4 Drawing Sheets

GENERAL PURPOSE DELAY LOGIC

PRIORITY UNDER 35 U.S.C. §119(e) & 37 C.F.R. §1.78

This nonprovisional application claims priority based upon the following prior United States provisional patent application entitled: "General Purpose Delay Logic," Application No.: 60/469,168, filed May 9, 2003, in the name(s) of Tyler J. Johnson, which is hereby incorporated by reference.

CROSS-REFERENCE TO RELATED APPLICATIONS

This application is related to U.S. patent application Ser. No. 10/402,092, filed Mar. 28, 2003, entitled A BUS INTERFACE MODULE; U.S. patent application Ser. No. 10/402,628, filed Mar. 28, 2003, entitled SYSTEM AND METHOD FOR USING A DEBUG BUS AS A CAPTURE BUFFER; U.S. patent application Ser. No. 10/402,122, filed Mar. 28, 2003, entitled SYSTEM AND METHOD FOR VERIFYING HDL EVENTS; and U.S. patent application Ser. No. 10/402,034, filed Mar. 28, 2003, entitled AN INTEGRATED CIRCUIT; U.S. patent application Ser. No. 60/469,575, filed May 10, 2003, entitled POST-SILICON TEST COVERAGE VERIFICATION; and U.S. patent application Ser. No. 60/469,350, filed May 9, 2003, entitled SYSTEM AND METHOD FOR PARSING HDL EVENTS FOR OBSERVABILITY; all of which are hereby incorporated by reference in their entirety.

BACKGROUND

The increasing complexity of system designs, increased investment required due to this complexity, and shortened product cycles have presented significant challenges to post-silicon design verification of chipsets. This is especially true with respect to high-end cache coherent non-uniform memory access ("ccNUMA") chipsets where systems can be extremely large and complex. Processor post-silicon verification is typically focused on electrical verification at least as much as functional verification due to the large amount of full custom design. Chipsets present a different challenge due to the large number of cells of which they are comprised. Additionally, due to the sheer number of buses, internal bus arbitration, cache coherency control, queue arbitration, etc., in a large ccNUMA server, post-silicon functional verification of such a chipset consumes a greater amount of resources with respect to electrical verification than processors typically consume. Internal observability, while relatively simple in pre-silicon verification, poses a major obstacle to debug and functional test coverage.

Determining when system verification is complete is a second major obstacle to completing post-silicon verification in a time-effective manner. While pre-silicon simulation-based testing depends significantly on labor intensive directed and pseudo-random testing, post-silicon testing has historically depended on observing system operations that imply correct behavior.

Performing post-silicon design verification is an industry standard practice that facilitates exposure of bugs not typically uncovered in pre-silicon verification. Typical post-silicon bugs discovered include those that are manifested after long or at-speed operation of the system, those resulting due to incorrect modeling of hardware and firmware interfaces, those resulting from Register-Transfer Language ("RTL") errors that escaped pre-silicon detection, and those resulting from incorrect mapping of RTL-to-silicon (synthesis/physical bugs). Accepted methods of exercising systems to expose post-silicon bugs include running operating systems and software applications targeted for the final system, creating specific directed software tests that stress different portions of the system, and running software tests that create random system operations.

Real-time observability ("RTO") refers to the ability to monitor and capture internal signals in real time either on- or off-chip. While internal signal observability features have been available in some field programmable gate array ("FPGA") architectures and application specific integrated circuits ("ASICs"), they have typically been of limited scope. Limiting factors have been silicon area, wiring constraints, and I/O limitations. In addition, observability features have traditionally been used for debug and not functional test coverage.

Often in the context of RTO, non-zero relative latencies exist between a pair of functional signals being observed. It may be the case that one or more cycles of delay must be introduced into one of the functional signals, thereby to equalize the relative latencies thereof. Those of ordinary skill in the art will recognize that there are many other reasons that a functional signal may need to be delayed by one or more clock cycles; for example, to change signal timing. Regardless of the reason for introducing a delay, it will be appreciated that it is desirable to be able to introduce a delay of a specified number of clock cycles using as few gates as possible to achieve that purpose.

SUMMARY

In one embodiment, the invention is directed to a logic circuit for delaying a signal input thereto a specified number of clock cycles X, wherein X is between 1 and $2^N$. The logic circuit comprises a demultiplexer ("DEMUX") comprising an input for receiving the signal and N outputs; a register array comprising $2^N$ clocked registers, wherein each of a first N of the clocked registers is connected to one of the N outputs of the DEMUX and wherein data is shifted out of one clocked register to a next clocked register on each clock cycle; and a multiplexer ("MUX") comprising M inputs, wherein each of the M inputs is connected to one of the clocked registers.

DETAILED DESCRIPTION OF THE DRAWINGS

Figure 1:
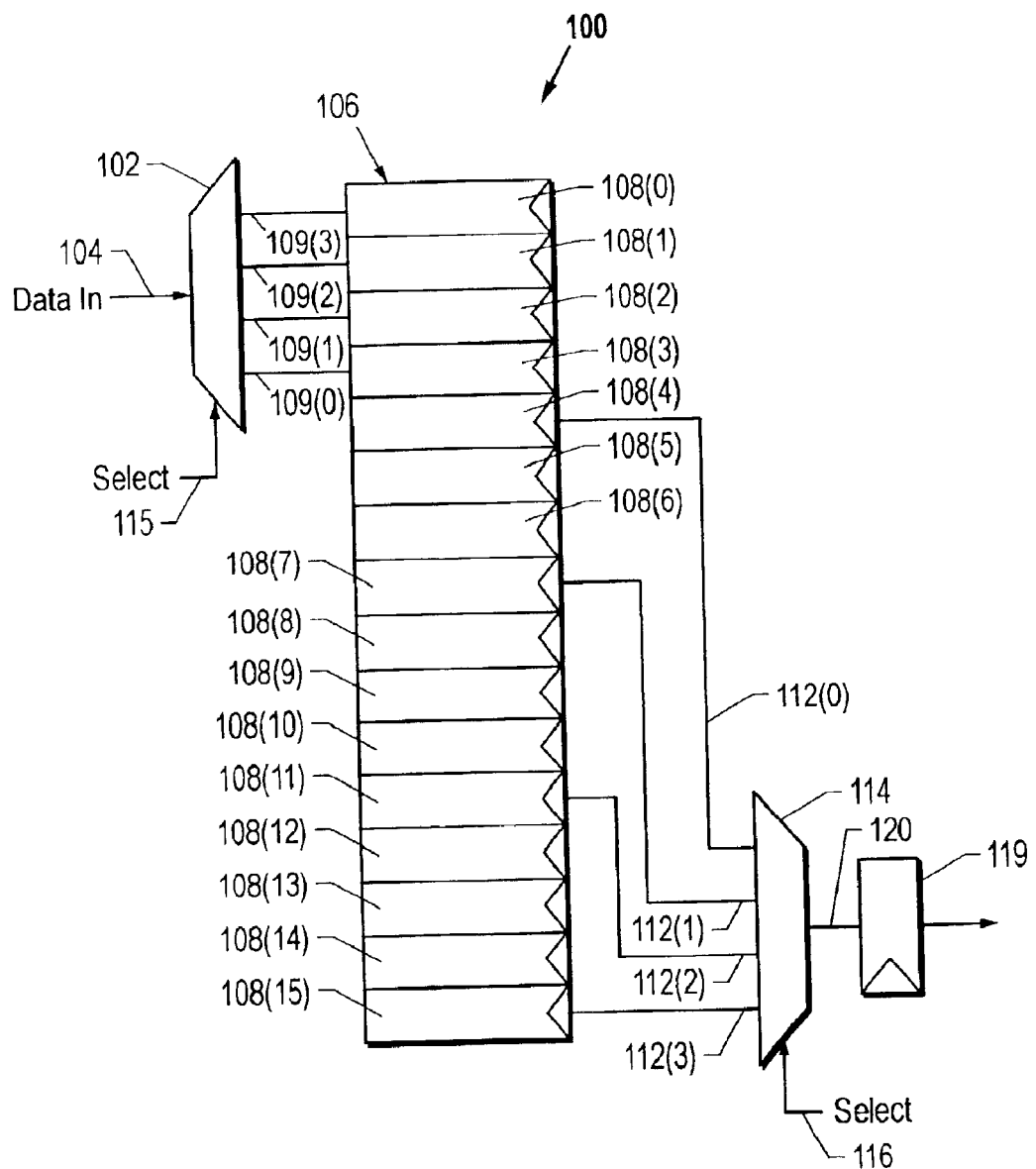
FIG. 1 is a functional block diagram of one embodiment of a general purpose programmable delay logic.

In the drawings, like or similar elements are designated with identical reference numerals throughout the several views thereof, and the various elements depicted are not necessarily drawn to scale.

An embodiment of the invention can be generally characterized as follows. Any delay of $2^N$ clock cycles can be realized using an N-way demultiplexer ("DEMUX") to drive data into a $2^N$ deep register array. The DEMUX outputs are routed to the first N registers in the array. For each register in the array, if data is not driven into that register directly by the DEMUX, data from the previous register is used. Thus, the register array operates in a manner similar to a shift register. To read the signal after the desired delay, the inputs of an N-way multiplexer ("MUX") are driven by each Nth register of the array. By using various values for the select signals of the DEMUX and the MUX, delays from 1 to $2^N$ are realizable. For delay maximums other than $2^N$, the unneeded registers may be omitted from the endo of the array and unused MUX inputs tied off.

FIG. 1 is a functional block diagram of an embodiment of a 1-to-$2^N$ delay logic 100, where N is equal to four. Accordingly, the delay logic 100 is capable of introducing into a signal delays of between 1 and 16 clock cycles. The delay logic 100 includes a 4-way DEMUX 102 that drives data input thereto via an input 104 into a register array 106 comprising 16 registers 108(0)–108(15). Each of four outputs 109(0)–109(3) of the DEMUX 102 is connected to one of the first N, in this case, four, registers (registers 108(0)–108(3)) of the array 106 as illustrated in FIG. 1.

Figure 2:
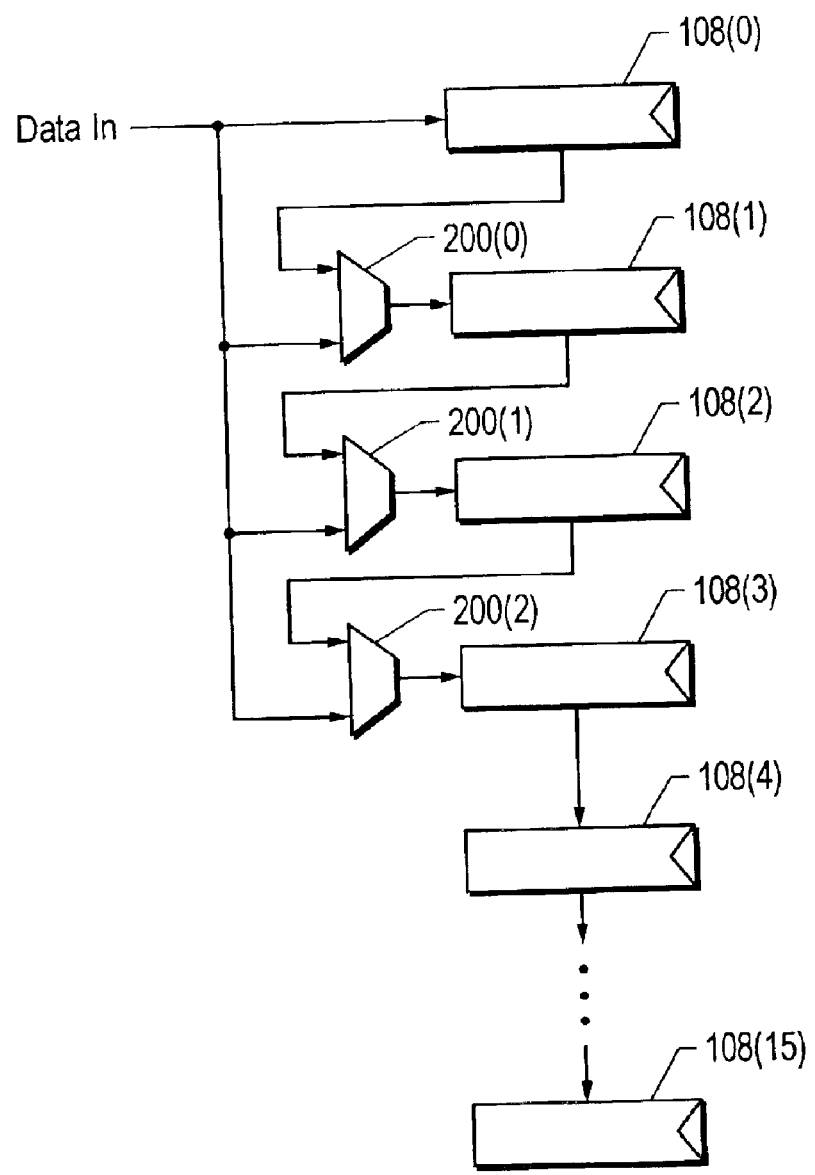
FIG. 2 is a more detailed block diagram of the general purpose programmable delay logic of FIG. 1.

As will be illustrated in greater detail in FIG. 2, for each register 108(0)–108(15) in the array 106, if data is not driven into that register directly from the DEMUX 102, data from the previous register is used. Thus, the register array 106 operates in a manner similar to a shift register.

To read the signal after the desired delay, inputs 112(0)–112(3) of a 4-way MUX 114 are driven by a respective one of each 4th register, i.e., registers 108(3), 108(7), 108(11), and 108(15), of the array 106. By using various values for DEMUX select input 115 and the MUX select input 116, delays from 1 to 16 are realizable with the delay logic 100. The delayed signal is output from the MUX 114, e.g., to a register 119, via an output 120.

For example, to realize a delay of one clock cycle, both the DEMUX 102 and the MUX 114 would be configured to select the register 108(3); that is, the DEMUX output 109(0) and the MUX input 112(0) would be selected via appropriate DEMUX and MUX select signals applied to the DEMUX select input 115 and MUX select input 116, respectively. To realize a delay of two clock cycles, the DEMUX 102 would be configured to select the register 108(2) and the MUX 114 would be configured to select the register 108(3); that is, the DEMUX output 109(1) and the MUX input 112(0) would be selected via appropriate DEMUX and MUX select signals applied to the DEMUX select input 115 and MUX select input 116, respectively. To realize a delay of three clock cycles, the DEMUX 102 would be configured to select the register 108(1) and the MUX 114 would be configured to select the register 108(3); that is, the DEMUX output 109(2) and the MUX input 112(0) would be selected via appropriate DEMUX and MUX select signals applied to the DEMUX select input 115 and MUX select input 116, respectively. To realize a delay of four clock cycles, the DEMUX 102 would be configured to select the register 108(0) and the MUX 114 would be configured to select the register 108(3); that is, the DEMUX output 109(3) and the MUX input 112(0) would be selected via appropriate DEMUX and MUX select signals applied to the DEMUX select input 115 and MUX select input 116, respectively.

To realize a delay of five clock cycles, the DEMUX 102 would be configured to select the register 108(3) and the MUX 114 would be configured to select the register 108(7); that is, the DEMUX output 109(0) and the MUX input 112(1) would be selected via appropriate DEMUX and MUX select signals applied to the DEMUX select input 115 and MUX select input 116, respectively. To realize a delay of six clock cycles, the DEMUX 102 would be configured to select the register 108(2) and the MUX 114 would be configured to select the register 108(7); that is, the DEMUX output 109(1) and the MUX input 112(1) would be selected via appropriate DEMUX and MUX select signals applied to the DEMUX select input 115 and MUX select input 116, respectively. To realize a delay of seven clock cycles, the DEMUX 102 would be configured to select the register 108(1) and the MUX 114 would be configured to select the register 108(7); that is, the DEMUX output 109(2) and the MUX input 112(1) would be selected via appropriate DEMUX and MUX select signals applied to the DEMUX select input 115 and MUX select input 116, respectively. To realize a delay of eight clock cycles, the DEMUX 102 would be configured to select the register 108(0) and the MUX 114 would be configured to select the register 108(7); that is, the DEMUX output 109(3) and the MUX input 112(1) would be selected via appropriate DEMUX and MUX select signals applied to the DEMUX select input 115 and MUX select input 116, respectively.

To realize a delay of nine clock cycles, the DEMUX 102 would be configured to select the register 108(3) and the MUX 114 would be configured to select the register 108(11); that is, the DEMUX output 109(0) and the MUX input 112(2) would be select ed via appropriate DEMUX and MUX select signals applied to the DEMUX select input 115 and MUX select input 116, respectively. To realize a delay of ten clock cycles, the DEMUX 102 would be configured to select the register 108(2) and the MUX 114 would be configured to select the register 108(11); that is, the DEMUX output 109(1) and the MUX input 112(2) would be selected via appropriate DEMUX and MUX select signals applied to the DEMUX select input 115 and MUX select input 116, respectively. To realize a delay of eleven clock cycles, the DEMUX 102 would be configured to select the register 108(1) and the MUX 114 would be configured to select the register 108(11); that is, the DEMUX output 109(2) and the MUX input 112(2) would be selected via appropriate DEMUX and MUX select signals applied to the DEMUX select input 115 and MUX select input 116, respectively. To realize a delay of twelve clock cycles, the DEMUX 102 would be configured to select the register 108(0) and the MUX 114 would be configured to select the register 108(11); that is, the DEMUX output 109(3) and the MUX input 112(2) would be selected via appropriate DEMUX and MUX select signals applied to the DEMUX select input 115 and MUX select input 116, respectively.

To realize a delay of thirteen clock cycles, the DEMUX 102 would be configured to select the register 108(3) and the MUX 114 would be configured to select the register 108 (15); that is, the DEMUX output 109(0) and the MUX input 112(3) would be selected via appropriate DEMUX and MUX select signals applied to the DEMUX select input 115 and MUX select input 116, respectively. To realize a delay of fourteen clock cycles, the DEMUX 102 would be configured to select the register 108(2) and the MUX 114 would be configured to select the register 108(15); that is, the DEMUX output 109(1) and the MUX input 112(3) would be selected via appropriate DEMUX and MUX select signals applied to the DEMUX select input 115 and MUX select input 116, respectively. To realize a delay of fifteen clock cycles, the DEMUX 102 would be configured to select the register 108(1) and the MUX 114 would be configured to select the register 108(15); that is, the DEMUX output 109(2) and the MUX input 112(3) would be selected via appropriate DEMUX and MUX select signals applied to the DEMUX select input 115 and MUX select input 116, respectively. To realize a delay of sixteen clock cycles, the DEMUX 102 would be configured to select the register 108(0) and the MUX 114 would be configured to select the register 108(15); that is, the DEMUX output 109(3) and the MUX input 112(3) would be selected via appropriate DEMUX and MUX select signals applied to the DEMUX select input 115 and MUX select input 116, respectively.

FIG. 2 is a more detailed block diagram of a particular implementation of the delay logic 100. As shown in FIG. 2, the functionality of the DEMUX 102 may be implemented using several 2×1 MUXes 200(0)–200(2) each having an output connected to a respective one of the registers 108(1)–108(3), a first input connected to receive data output from an immediately preceding register (i.e., registers 108(0)–108(2), respectively), and a second output connected to receive data input to the delay logic 100. In operation, if the register 108(0) is selected, each of the MUXes 200(0)–200(2) is configured such that the first input thereof is selected. If the register 108(1) is selected, the MUX 200(0) is configured such that the second input thereof is selected and each of the MUXes 200(1) and 200(2) is configured such that the first input thereof is selected. If the register 108(2) is selected, the MUX 200(1) is configured such that the second input thereof is selected and the MUX 200(2) is configured such that the first input thereof is selected. It does not matter which one of the inputs of the MUX 200(0) is selected. Finally, if the register 108(3) is selected, the MUX 200(2) is configured such that the second input thereof is selected. It does not matter which one of the inputs of the MUXes 200(0) and 200(1) are selected.

Figure 3:
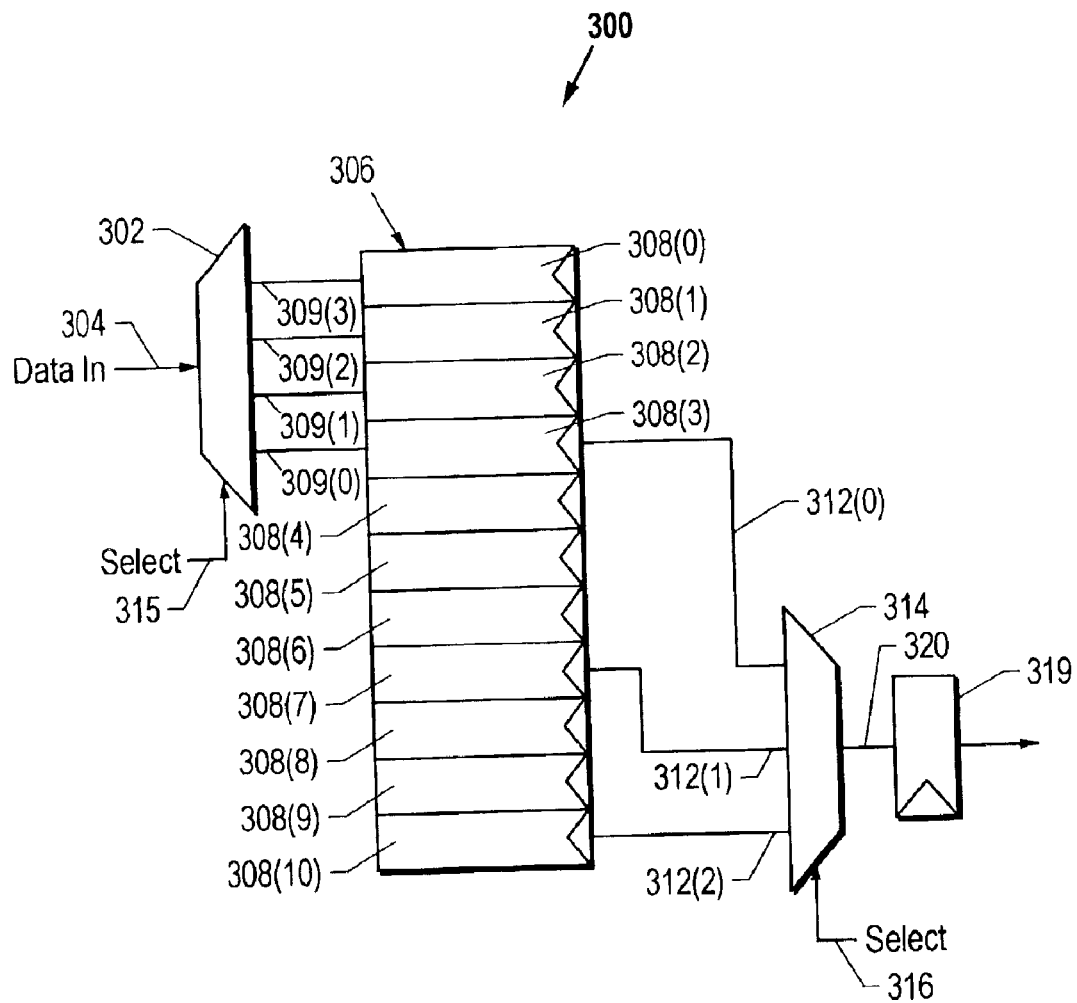
FIG. 3 is a functional block diagram of an alternative embodiment of a general purpose programmable delay logic.

As previously indicated, to realize delay maximums other than $2^N$, the unneeded registers (i.e., those beyond the desired delay maximum up to $2^N$) may be omitted from the end of the array and the unused MUX inputs tied off. FIG. 3 illustrates delay logic 300 for realizing a non-$2^N$ delay maximum of 11.

The delay logic 300 includes a 4-way DEMUX 302 that drives data input thereto via an input 304 into a register array 306 comprising 11 registers 308(0)–308(10). Each of four outputs 309(0)–309(3) of the DEMUX 302 is connected to one of the first N, in this case, four, registers (registers 308(0)–308(3)) of the array 306 as illustrated in FIG. 3.

To read the signal after the desired delay, inputs 312(0) and 312(1) of a MUX 314 are driven by a respective one of each 4th register, i.e., registers 308(3) and 308(7), of the array 306. Input 312(2) of the MUX 314 is driven by the last register of the array 306, i.e., the register 308(10). A fourth input of the MUX 314 is tied off and not illustrated in FIG. 3. By using various values for DEMUX select input 315 and the MUX select input 316, delays from 1 to 11 are realizable with the delay logic 300. The delayed signal is output from the MUX 314, e.g., to a register 319, via an output 320.

Figure 4:
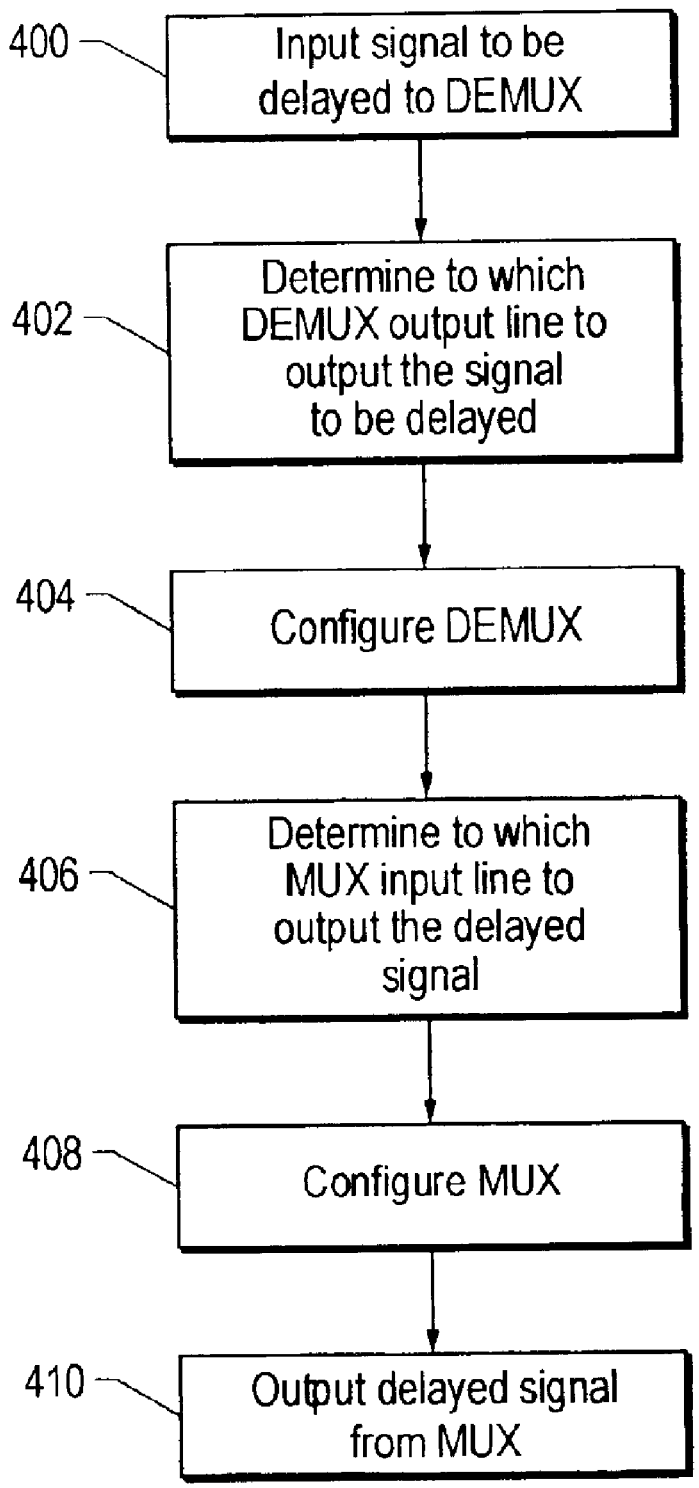
FIG. 4 is a flowchart of the operation of the general purpose programmable delay logic of FIG. 1.

FIG. 4 is a flowchart of the operation of the delay logic 100 of FIG. 1. In step 400, a signal to be delayed by a specified number of clock cycles X is input to the DEMUX 102. In step 402, a determination is made as to which output line 109(0)–109(3) on which the signal should be output from the DEMUX 102 (that is, to which register 108(0)–108(3) of the array 106 the signal should be input) based on the desired delay. In particular, assuming, as is the case with the delay logic 100, that the highest order DEMUX output (i.e., the output 109(3)) is connected to the first register of the array (i.e., the register 108(0)) and that the lowest order DEMUX output (i.e., the output 109(0)) is connected to the Nth register of the array (i.e., the register 108(3)), the selected output of the DEMUX 102 is identified by 109(R), where R is the remainder of the equation (X+3)/4. For example, for a one clock cycle delay, the remainder of (1+3)/4 is 0; therefore, the output is identified by 109(0). Similarly, for an eight clock cycle delay, the remainder of (8+3)/4 is 3; therefore, the output is identified by 109(3). In step 404, the DEMUX 102 is configured as determined in step 402 by applying appropriate select signals to the DEMUX select input 115.

In step 406 a determination is made as to which input line 112(0)–112(3) on which the signal should be input to the MUX 114 (that is, from which register 108(3), 108(7), 108(11), and 108(15) of the array 106 the signal should be output) based on the desired delay. In particular, assuming, as is the case with the delay logic 100, that the lowest order MUX input (i.e., the input 112(0)) is connected to the Nth register of the array 106 (i.e., the register 108(3)), that the highest order MUX input (i.e., the input 112(3)) is connected to the last register of the array (i.e., the register 108(15)), the selected input of the MUX 114 is identified by 112(A), such that:

$$A \cdot N < X \leq (A+1) \cdot N$$

For example, for a one clock cycle delay, A must be equal to 0; therefore, the input is identified by 112(0). Similarly, for a twelve clock cycle delay, A must be equal to 2; therefore, the input is identified by 112(2). In step 408, the MUX 114 is configured as determined in step 406 by applying appropriate select signals to the MUX select input 116. In step 410, the delayed signal is output from the MUX 114.

An implementation of the invention described herein thus provides an architecture topology for enabling real-time observability in an IC. The embodiments shown and described have been characterized as being illustrative only; it should therefore be readily understood that various changes and modifications could be made therein without departing from the scope of the present invention as set forth in the following claims. For example, while particular logic circuits, gates, and elements are illustrated as being used to implement the embodiments shown herein, it will be appreciated that other equivalent logic circuits and elements may be used.

Accordingly, all such modifications, extensions, variations, amendments, additions, deletions, combinations, and the like are deemed to be within the ambit of the present invention whose scope is defined solely by the claims set forth hereinbelow.

What is claimed is:

1. A logic circuit for delaying a signal input thereto a specified number of clock cycles X, wherein X is between 1 and $2^N$, the logic circuit comprising:
   a demultiplexer ("DEMUX") comprising an input for receiving the signal and N outputs;
   a register array comprising $2^N$ clocked registers, wherein each of a first N of the clocked registers is connected to one of the N outputs of the DEMUX and wherein data is shifted out of one clocked register to a next clocked register on each clock cycle; and
   a multiplexer ("MUX") comprising M inputs, wherein each of the M inputs is connected to one of the clocked registers.

2. The logic circuit of claim 1 wherein the DEMUX includes a select input and wherein a signal input to the select input selects one of the N outputs of the DEMUX.

3. The logic circuit of claim 2 wherein the highest order DEMUX output is connected to the first clocked register of the register array and the lowest order DEMUX output is connected to the Nth clocked register of the register array.

4. The logic circuit of claim 3 wherein the selected output of the DEMUX is the Rth output, where R is the remainder of the equation (X+3)/4.

5. The logic circuit of claim 1 wherein a first M−1 of the M outputs are connected to every Nth clocked register of the register array and the remaining one of the M outputs is connected to a last clocked register of the register array.

6. The logic circuit of claim 1 wherein M is equal to N.

7. The logic circuit of claim 6 wherein a subgroup of the register array comprises every Nth clocked register thereof and wherein each of the M inputs of the MUX is connected to one register of the register array subgroup.

8. The logic circuit of claim 7 wherein the MUX includes a select input and wherein a signal input to the select input selects one of the M inputs of the MUX.

9. The logic circuit of claim 8 wherein the selected input is the Ath input, wherein $A \cdot N < X \leq (A+1) \cdot N$.

10. A circuit for delaying a signal a specified number of clock cycles X, wherein X is between 1 and $2^N$, the circuit comprising:
   means for inputting a signal to a selected one of N registers comprising a register array;
   means for shifting the signal from the selected one of the N registers to a next one of the N registers of the register array on each clock cycle (X−1) times until the signal reaches a final one of the N registers of the register array; and
   means for outputting the signal from the final one of the N registers subsequent to the shifting.

11. The circuit of claim 10 wherein the means for inputting comprises a demultiplexer ("DEMUX") having one input for receiving the signal and N outputs, wherein each of the N outputs of the DEMUX is connected to one of the first N registers of the register array.

12. The circuit of claim 11 wherein the DEMUX comprises a select input for receiving a select signal to select one of the N outputs of the DEMUX.

13. The circuit of claim 12 wherein the highest order DEMUX output is connected to the first clocked register of the register array and the lowest order DEMUX output is connected to the Nth clocked register of the register array.

14. The circuit of claim 13 further comprising means for selecting the Rth output of the DEMUX, wherein R is the remainder of the equation (X+3)/4.

15. The circuit of claim 10 wherein a first M−1 of the M outputs are connected to every Nth clocked register of the register array and the remaining one of the M outputs is connected to a last clocked register of the register array.

16. The circuit of claim 10 wherein M is equal to N.

17. The circuit of claim 16 wherein a subgroup of the register array comprises every Nth clocked register thereof and wherein each of the M inputs of the MUX is connected to one register of the register array subgroup.

18. The circuit of claim 17 wherein the MUX comprises a select input for receiving a select signal to select one of the M inputs of the MUX.

19. The circuit of claim 18 further comprising means for selecting the Ath input of the MUX, wherein $A \cdot N < X \leq (A+1) \cdot N$.

20. A method of delaying a signal a specified number of clock cycles X, wherein X is between 1 and $2^N$, the method comprising:
   inputting a signal to a selected one of N registers comprising a register array;
   on each clock cycle, shifting the signal from the selected one of the N registers to a next one of the N registers of the register array (X−1) times until the signal reaches a final one of the N registers of the register array; and
   subsequent to the shifting, outputting the signal from the final one of the N registers.

21. The method of claim 20 wherein the inputting comprises inputting the signal to an input of a demultiplexer ("DEMUX") and outputting the signal via a selected one of N outputs of the DEMUX, wherein each of the N outputs of the DEMUX is connected to one of the first N registers of the register array.

22. The method of claim 21 further comprising inputting a select signal to a select input of the DEMUX to select one of the N outputs of the DEMUX.

23. The method of claim 22 wherein the highest order DEMUX output is connected to the first clocked register of the register array and the lowest order DEMUX output is connected to the Nth clocked register of the register array.

24. The method of claim 23 further comprising selecting the Rth output of the DEMUX, wherein R is the remainder of the equation (X+3)/4.

25. The method of claim 20 wherein a first M−1 of the M outputs are connected to every Nth clocked register of the register array and the remaining one of the M outputs is connected to a last clocked register of the register array.

26. The method of claim 20 wherein M is equal to N.

27. The method of claim 26 wherein a subgroup of the register array comprises every Nth clocked register thereof, the method further comprising connecting each of the M inputs of the MUX to one register of the register array subgroup.

28. The method of claim 27 further comprising inputting a signal input to a select input of the MUX to select one of the M inputs of the MUX.

29. The method claim 28 further comprising selecting the Ath input of the MUX, wherein $A \cdot N < X \leq (A+1) \cdot N$.

* * * * *